United States Patent
Ross et al.

(10) Patent No.: US 11,557,893 B2
(45) Date of Patent: Jan. 17, 2023

(54) QUENCH PROTECTION IN SUPERCONDUCTING MAGNETS

(71) Applicant: TOKAMAK ENERGY LTD, Oxfordshire (GB)

(72) Inventors: John Ross, Oxfordshire (GB); Paul Noonan, Oxfordshire (GB)

(73) Assignee: TOKAMAK ENERGY LTD, Abingdon (GB)

( * ) Notice: Subject to any disclaimer, the term of this patent is extended or adjusted under 35 U.S.C. 154(b) by 1350 days.

(21) Appl. No.: 15/757,187

(22) PCT Filed: Sep. 2, 2016

(86) PCT No.: PCT/GB2016/052712
§ 371 (c)(1),
(2) Date: Mar. 2, 2018

(87) PCT Pub. No.: WO2017/042541
PCT Pub. Date: Mar. 16, 2017

(65) Prior Publication Data
US 2018/0248357 A1    Aug. 30, 2018

(30) Foreign Application Priority Data

Sep. 9, 2015 (GB) ...................... 1515979

(51) Int. Cl.
*H02H 7/00* (2006.01)
*H01F 6/02* (2006.01)
(Continued)

(52) U.S. Cl.
CPC ......... *H02H 7/001* (2013.01); *G01R 33/3815* (2013.01); *H01F 6/02* (2013.01);
(Continued)

(58) Field of Classification Search
CPC .. H02H 7/00; H02H 7/001; H01F 6/06; H01F 6/02; H01F 6/065; H01F 6/008;
(Continued)

(56) References Cited

U.S. PATENT DOCUMENTS 4,393,429 A    7/1983    Maki et al.
2007/0063799 A1    3/2007    Umans
(Continued)

FOREIGN PATENT DOCUMENTS

CN    103081021 A    5/2013
CN    104124033 A    10/2014
(Continued)

OTHER PUBLICATIONS

Great Britian Search Report for Application No. GB1515979.1 dated Jan. 20, 2016; 4 pgs.
(Continued)

*Primary Examiner* — Danny Nguyen
(74) *Attorney, Agent, or Firm* — Cantor Colburn LLP

(57) ABSTRACT

A method of protecting a superconducting magnet from quenches, the superconducting magnet having at least one primary coil comprising high temperature superconductor, HTS, material. A secondary HTS tape is provided, the secondary HTS tape being in proximity to and electrically insulated from the primary coil, and being configured to cease superconducting at a lower temperature than the primary coil during operation of the magnet. A loss of superconductivity in the secondary HTS tape is detected. In response to said detection, energy is dumped from the primary coil into an external resistive load.

11 Claims, 2 Drawing Sheets

(51) Int. Cl.
*G01R 33/3815* (2006.01)
*H02H 9/00* (2006.01)
*H01F 7/00* (2006.01)
*H01F 41/04* (2006.01)
*H01F 6/06* (2006.01)
*H01L 39/16* (2006.01)

(52) U.S. Cl.
CPC ............... *H01F 6/06* (2013.01); *H01F 7/00* (2013.01); *H01F 41/048* (2013.01); *H02H 9/00* (2013.01); *H01L 39/16* (2013.01)

(58) Field of Classification Search
CPC .... G01R 33/12; G01R 33/1238; G01R 33/38; G21B 1/21; G21B 1/23
USPC .......................................................... 361/19
See application file for complete search history.

(56) References Cited

U.S. PATENT DOCUMENTS

2010/0056378 A1* 3/2010 Timinger ........... G01R 33/3815
324/322
2017/0237252 A1* 8/2017 Mihálffy ................. H01L 39/16
505/191

FOREIGN PATENT DOCUMENTS

| | | |
|---|---|---|
| EP | 2755216 A1 | 7/2014 |
| JP | S6344710 A | 2/1988 |
| JP | S6452331 A | 2/1989 |
| JP | 2000277322 A | 10/2000 |
| JP | 2006332559 A | 12/2006 |
| JP | 200816554 A | 1/2008 |
| JP | 2011238455 A | 11/2011 |
| JP | 2014529744 A | 11/2014 |
| WO | 2011154717 A1 | 12/2011 |
| WO | 2013030554 A1 | 3/2013 |
| WO | 2014049501 A1 | 4/2014 |
| WO | 2015072001 A1 | 5/2015 |

OTHER PUBLICATIONS

International Search Report and Written Opinion for International Application No. PCT/GB2016/052712 dated Dec. 19, 2016; 14 pgs.
International Preliminary Report on Patentability for Application No. PCT/GB2016/052712 dated Mar. 13, 2018.

* cited by examiner

QUENCH PROTECTION IN SUPERCONDUCTING MAGNETS

CROSS REFERENCE TO RELATED APPLICATIONS

This application is a National Stage Application of Patent Application PCT/GB2016/052712 filed on Sep. 2, 2016, which claims the benefit of and priority to Great Britain Application No. GB1515979.1, filed Sep. 9, 2015, the contents of which are incorporated herein by reference in their entirety.

FIELD OF THE INVENTION

The invention relates to quench protection in superconducting magnets. In particular, the invention relates to methods and apparatus for identifying possible quenches so that preventative action can be taken in magnets comprising high temperature superconductor.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore reach high fields with lower losses than conventional electromagnets.

Superconductivity only occurs in certain materials, and only at low temperatures. A superconducting material will behave as a superconductor in a region defined by the critical temperature of the superconductor (the highest temperature at which the material is a superconductor in zero magnetic field) and the critical field of the superconductor (the highest magnetic field in which the material is a superconductor at 0K). The temperature of the superconductor and the magnetic field present limit the current which can be carried by the superconductor without the superconductor becoming resistive.

Broadly speaking, there are two types of superconducting material. Low temperature superconductors (LTS) have critical temperatures below 30-40K, and high temperature superconductors (HTS) have critical temperatures above 30-40K. Many current HTS materials have critical temperatures above 77K, which allows the use of liquid nitrogen for cooling.

One problem which can occur in superconducting magnets is quenching. Quenching occurs when a part of the superconducting coil enters the resistive state. This may occur due to fluctuations in temperature or magnetic field, or physical damage or defects in the superconductor (e.g. by neutron irradiation if the magnet is used in a fusion reactor). Due to the high currents present in the magnet, when even a small part of the superconductor becomes resistive, it quickly heats up. In LTS magnets, this quickly raises the temperature of the surrounding regions. This causes the surrounding regions to become resistive as well, and this continues in a chain reaction which can turn the entire magnet resistive very rapidly (up to several seconds, depending on the size of the coil).

Due to the greater temperature margins for HTS magnets, and the higher specific heats of the materials at higher temperatures, quenches in HTS magnets do not propagate as quickly. This can result in greater damage to the magnet, as all of the energy in the magnet is deposited in a very small resistive volume.

A quench results in the energy in the magnet being converted into heat, which will vaporise any liquid coolant, and may cause permanent damage to the magnet. The energy stored in the magnetic field is given by:

$$W = \frac{1}{2}\int B \cdot H dr$$

I.e. the greater the flux density and the higher the volume, the greater the stored energy of the magnet. The energy released by a powerful magnet can be on a similar order to a stick of dynamite exploding.

The conventional approach to quench management is to provide an external resistive load into which the current can be "dumped" when a localised quench is detected. A simplified schematic of this is shown in FIG. 1. During normal operation, switch 1 is closed and switch 2 is open, which short circuits the voltage dump. When a quench is detected, switch 2 is closed and switch 1 is opened. This short circuits the power supply 4, and forces the current from the superconducting magnet 3 through the constant voltage dump 5 (i.e. the external resistive load). For HTS magnets, current can be dumped into sections of the magnet away from the original hot spot so as to spread the energy deposition over more of the coil, and therefore limit the temperature rise at any one spot.

As shown in FIG. 2, HTS tape 11 is sandwiched between layers of copper 12 to form a conductor such as a cable. The copper stabiliser 12 acts as an external resistive load for the HTS tape 11. The copper stabiliser 12 acts to conduct away the excess current during a quench (shown by current flow 14), and also removes some of the heat. The rate at which the initial hot zone 13 of the quench heats can be reduced by increasing the amount of copper in the HTS conductor, which reduces the resistance of the copper and increases its heat capacity.

However, in applications where small diameter conductors are desired, the copper stabiliser adds significantly to the size of the conductors. For example, in a spherical tokamak nuclear fusion reactor, the central column needs to be as small as possible in order to keep the device size and cost as small as possible and to increase the efficiency of the reactor (both by increasing the aspect ratio, and by increasing the magnetic field at the inner surface of the plasma). Thinner conductors mean that the magnets can be made more compact in any application, and increase the field available in certain geometries (i.e. for geometries where the magnetic field varies with distance from the current, then having a thick layer of copper will increase the distance between the current and the area where the field is used).

If a quench can be quickly detected and the dump system activated quickly, then the amount of copper required can be reduced. However, an overly sensitive detection system will tend to produce false triggers, which cause the magnet to be shut down unnecessarily. It is therefore important to get the fastest possible quench detection with minimal noise.

FIG. 3 shows a graph of hot spot temperature during a quench, with a dump activation time of 2 s. The temperature increases from 30K to 217K. However, if the quench could be detected and the dump switch opened within 1 s, then the amount of copper can be significantly reduced for the same temperature rise (in this case, reduced to 83% of the original cross sectional area).

The conventional approach to quench detection is to use a voltage tap across the superconducting coil. In essence, the voltage across the coil is measured, and if any voltage is detected outside of a specified band of voltages, then this is a sign that a part of the coil has become resistive and a quench is starting. However, the initial hot zone is generally very small, and so the resistance (and therefore the voltage generated) is low. During energisation of the magnet, there will also be inductive voltage effects which may swamp the resistive voltage, even if efforts are made to cancel these out. Filtering a genuine quench signal from a noisy background signal takes time, and has a high error rate.

SUMMARY

According to an aspect, there is provided a method of protecting a superconducting magnet from quenches, the superconducting magnet having at least one primary coil comprising high temperature superconductor, HTS, material. A secondary HTS tape is provided, the secondary HTS tape being in proximity to and electrically insulated from the primary coil, and being configured to cease superconducting at a lower temperature than the primary coil during operation of the magnet. A loss of superconductivity in the secondary HTS tape is detected. In response to said detection, energy is dumped from the primary coil into an external resistive load.

During operation of the magnet a current in the secondary HTS tape may be a higher fraction of its critical current than a current in the primary coil.

The secondary HTS tape may be provided as a pair of tapes, with the tapes carrying current in opposite directions and being laid parallel and adjacent to each other.

Detecting a loss of superconductivity may comprise detecting a voltage difference in excess of a predetermined value between two points of the secondary HTS tape.

According to a second aspect, there is provided a quench protection system for use with a superconducting magnet having at least one primary coil comprising high temperature superconductor, HTS, material. The system comprises a secondary HTS tape, a detection unit, and a quench protection unit. The secondary HTS tape is configured to be positioned in proximity to and insulated from the primary coil of the magnet, and to cease superconducting at a lower temperature than the primary coil during operation of the magnet. The detection unit is configured to detect a loss of superconductivity in the secondary HTS tape. The quench protection unit is configured to cause energy to be dumped from the primary coil to an external resistive load in response to said detection.

The secondary HTS tape may comprise a pair of HTS tapes laid parallel and adjacent to each other and configured to carry current in opposite directions.

According to a further aspect, there is provided superconducting magnet comprising a primary coil and the quench protection system according to the second aspect, the primary coil comprising high temperature superconductor, HTS, material.

According to a yet further aspect, there is provided a toroidal or poloidal field coil for a nuclear fusion reactor, the toroidal or poloidal field coil comprising high temperature superconductor, HTS, material and a quench protection system according to the second aspect.

DETAILED DESCRIPTION

Figure 1:
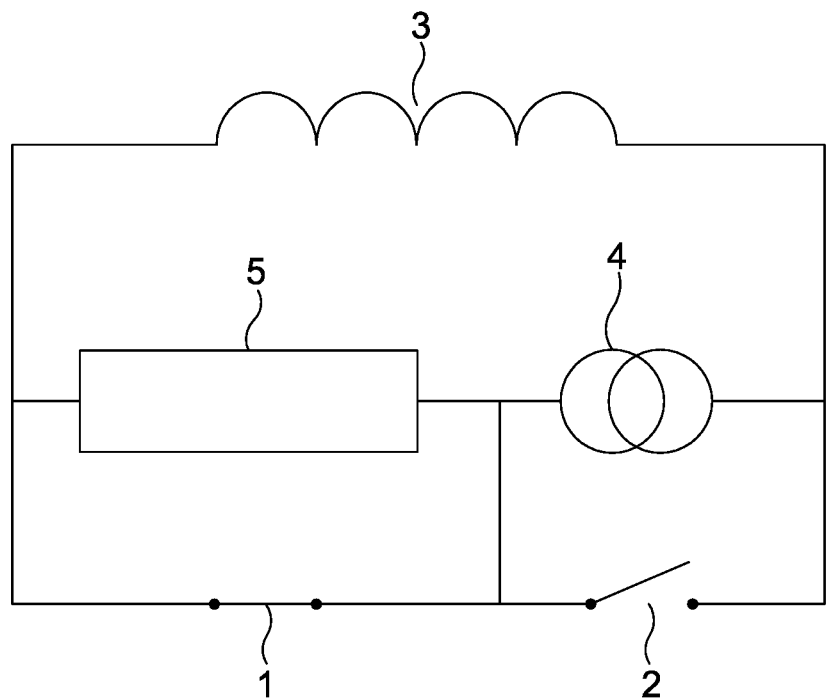
FIG. 1 is a circuit diagram of a part of a quench protection system.
Figure 2:
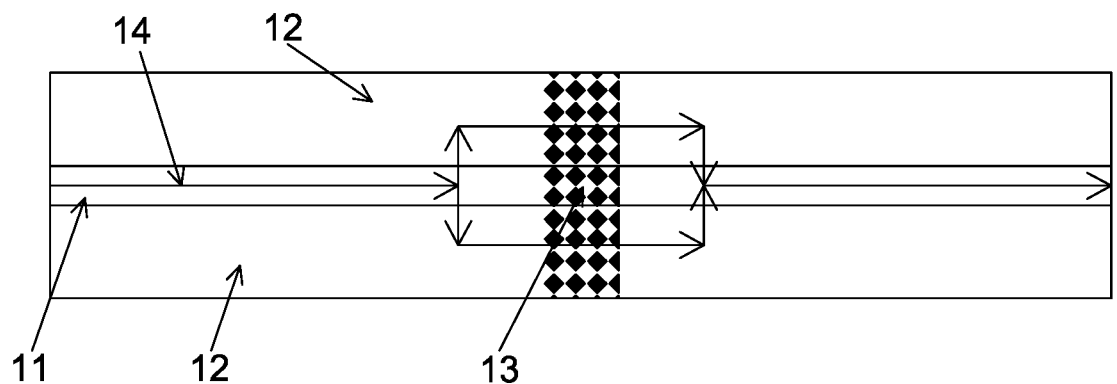
FIG. 2 is a schematic illustration of a hot spot in an HTS conductor.
Figure 3:
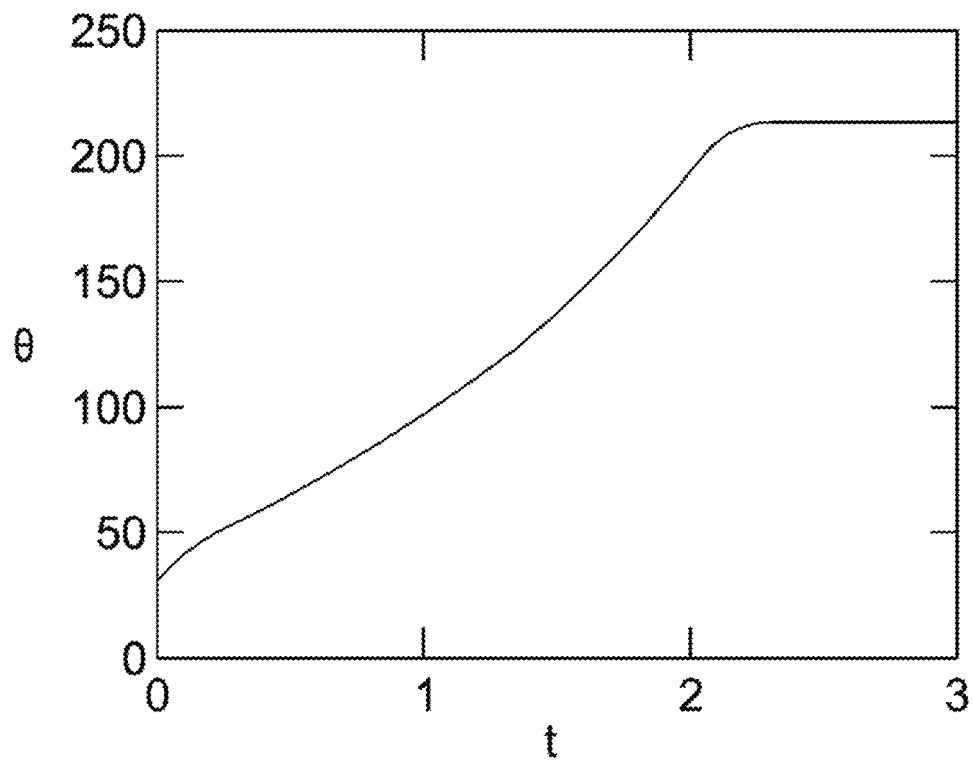
FIG. 3 is a graph of temperature against time for a hot spot in an exemplary HTS conductor.

In order to provide faster and more reliable quench detection, either the noise which obscures the quench detection signal must be reduced, or the signal itself must be increased. A solution is proposed below, which provides greatly improved detection speed and reliability compared to conventional methods.

The second solution involves the use of "canary tape". A secondary HTS tape is provided in proximity to the ("primary") coil of the magnet. The secondary tape is configured such that it will cease superconducting at a lower temperature during operation of the magnet, for example at a temperature about 5K to about 80K lower than the temperature at which the primary coil ceases superconducting. The secondary HTS tape may be physically weakened e.g. by neutron irradiation or chemical etching, or may be of an alternative HTS material with lower critical temperature than the HTS of the primary coil.

Since the secondary HTS tape ceases superconducting at a lower temperature than the primary coil, it will generally become resistive sooner than the primary coil, or will quickly become resistive if a hotspot forms in the primary coil. Therefore, a voltage across the secondary tape can be taken as an indication that a quench is likely in the primary tape. Since the secondary tape is not required for the functioning of a magnet, detection of the quench can wait until the voltage drop across the secondary HTS tape is high enough to easily stand out from the electrical noise, which greatly reduces the risk of false alerts, and thus the processing (and time) needed to detect the signal. Once a quench is detected, the quench detection system causes the energy in the magnet to the dumped to an external resistive load, mitigating the effects of the quench.

In one embodiment, the secondary HTS tape is provided as a pair of tapes which are laid parallel and adjacent to each other, and which carry current in opposite directions. This ensures that the field produced by the secondary tapes is substantially cancelled out, and that the size of the loop enclosed by the secondary tape is minimised, which reduces inductive effects.

The secondary tape may carry a much lower current than the primary coil, so that the secondary tape needs very little copper to protect it in the event of a quench. In one embodiment, the secondary tape may be treated as disposable, and provided with little or no protection, but this requires that the energy released by a quench in the secondary tape is not sufficient to cause damage to other components of the magnet. The magnet may be configured such that the secondary tape can be easily replaced after the energy is dumped from the magnet.

Multiple secondary tapes may be provided in different regions of the magnet, with properties dependent on that region. For example, the tape used in the central column of a toroidal field coil at 18 T might not detect a quench in the return limb at 2 T until it was too late, therefore a more sensitive tape may be used in the lower magnetic field.

Figure 4:
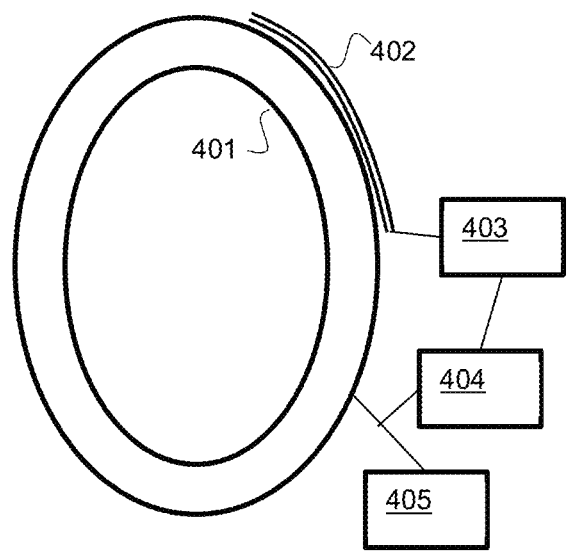
FIG. 4 is a schematic illustration of a superconducting magnet comprising a primary coil and a quench protection system.

FIG. 4 shows a superconducting magnet having a primary coil 401 and a quench protection system. The primary coil 401 comprises HTS material. The system comprises a secondary HTS tape 402, a detection unit 403, and a quench protection unit 404. The secondary HTS tape 402 is configured to be positioned in proximity to and insulated from the primary coil 401 of the magnet, and to cease superconducting at a lower temperature than the primary coil during operation of the magnet. The detection unit 403 is configured to detect a loss of superconductivity in the secondary HTS tape 402. The quench protection unit 404 is configured to cause energy to be dumped from the primary coil 401 to an external resistive load 405 in response to said detection.

The invention claimed is:

1. A method of protecting a superconducting magnet from quenches, the superconducting magnet having at least one primary coil comprising high temperature superconductor, HTS, material, the method comprising:
   providing a secondary HTS tape, the secondary HTS tape being in proximity to and electrically insulated from the primary coil, and being configured to cease superconducting at a lower temperature than the primary coil during operation of the magnet;
   detecting a loss of superconductivity in the secondary HTS tape; and
   in response to said detection, dumping energy from the primary coil into an external resistive load.

2. The method according to claim 1, wherein during operation of the magnet a current in the secondary HTS tape is a higher fraction of its critical current than a current in the primary coil.

3. The according to claim 1, wherein the secondary HTS tape is provided as a pair of tapes, with the tapes carrying current in opposite directions and being laid parallel and adjacent to each other.

4. The according to claim 1, wherein detecting a loss of superconductivity comprises detecting a voltage difference in excess of a predetermined value between two points of the secondary HTS tape.

5. The according to claim 1, wherein the difference between the temperature at which the secondary HTS tape ceases superconducting and the temperature at which the HTS tape of the primary coil ceases superconducting is about 5 Kelvin to about 80 Kelvin.

6. A quench protection system for use with a superconducting magnet having at least one primary coil comprising high temperature superconductor, HTS, material, the system comprising:
   a secondary HTS tape configured to be positioned in proximity to and insulated from the primary coil of the magnet, and to cease superconducting at a lower temperature than the primary coil during operation of the magnet;
   a detection unit configured to detect a loss of superconductivity in the secondary HTS tape; and
   a quench protection unit configured to cause energy to be dumped from the primary coil to an external resistive load in response to said detection.

7. The quench protection system according to claim 6, wherein the secondary HTS tape comprises a pair of HTS tapes laid parallel and adjacent to each other and configured to carry current in opposite directions.

8. A superconducting magnet comprising a primary coil and the quench protection system according to claim 7, the primary coil comprising high temperature superconductor, HTS, material.

9. A toroidal or poloidal field coil for a nuclear fusion reactor, the toroidal or poloidal field coil comprising high temperature superconductor, HTS, material and a quench protection system according to claim 7.

10. The method according to claim 1, wherein the secondary HTS tape is configured to be disposable or replaceable with another secondary HTS tape.

11. The quench protection system according to claim 7, wherein the secondary HTS tape is configured to be disposable or replaceable with another secondary HTS tape.

* * * * *